US010073750B2

(12) United States Patent
Pickerd et al.

(10) Patent No.: US 10,073,750 B2
(45) Date of Patent: Sep. 11, 2018

(54) SERIAL DATA LINK MEASUREMENT AND SIMULATION SYSTEM

(71) Applicant: Tektronix, Inc., Beaverton, OR (US)

(72) Inventors: John J. Pickerd, Hillsboro, OR (US); Kan Tan, Portland, OR (US); Kalev Sepp, Portland, OR (US); Sarah R. Boen, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 861 days.

(21) Appl. No.: 13/758,614

(22) Filed: Feb. 4, 2013

(65) Prior Publication Data
US 2013/0332101 A1 Dec. 12, 2013

Related U.S. Application Data

(60) Provisional application No. 61/658,368, filed on Jun. 11, 2012.

(51) Int. Cl.
G06F 17/50 (2006.01)
G06F 11/30 (2006.01)
H04B 3/46 (2015.01)
H04L 25/03 (2006.01)

(52) U.S. Cl.
CPC ............. G06F 11/30 (2013.01); H04B 3/46 (2013.01); G06F 17/5022 (2013.01); H04L 25/03057 (2013.01)

(58) Field of Classification Search
USPC ............. 702/6, 66, 67, 119, 120; 345/440; 73/862.045; 709/227; 340/712; 349/151
See application file for complete search history.

(56) References Cited

U.S. PATENT DOCUMENTS

| 4,763,117 A * | 8/1988 | Blattner et al. ............... 345/156 |
| 5,130,932 A * | 7/1992 | Kaihara .......... G05B 19/41885 700/97 |
| 6,263,476 B1 * | 7/2001 | Browen et al. ................. 703/17 |
| 6,515,484 B1 * | 2/2003 | Bald et al. ..................... 324/551 |
| 6,629,269 B1 * | 9/2003 | Kahkoska ....................... 714/43 |
| 2003/0236640 A1 * | 12/2003 | Naroska et al. ................ 702/67 |

(Continued)

OTHER PUBLICATIONS

Brief LAB-WM778, which is titled "Using LeCroy's EyeDoctor™ II" and dated Mar. 11, 2009.*

(Continued)

Primary Examiner — Mischita Henson
Assistant Examiner — Christine Liao
(74) Attorney, Agent, or Firm — Miller Nash Graham & Dunn; Andrew J. Harrington

(57) ABSTRACT

A serial data link measurement and simulation system for use on a test and measurement instrument presents on a display device. A main menu having elements representing a measurement circuit, a simulation circuit and a transmitter. The main menu includes processing flow lines pointing from the measurement circuit to the transmitter and from the transmitter to the simulation circuit. The main menu includes a source input to the measurement circuit and one or more test points from which waveforms may be obtained. The simulation circuit includes a receiver. The measurement and simulation circuits are defined by a user, and the transmitter is common to both circuits so all aspects of the serial data link system are tied together.

9 Claims, 11 Drawing Sheets

(56) References Cited

U.S. PATENT DOCUMENTS

| | | | |
|---|---|---|---|
| 2004/0183985 A1* | 9/2004 | Taguchi | 349/151 |
| 2010/0085362 A1* | 4/2010 | Tan | 345/440 |
| 2010/0297595 A1* | 11/2010 | Schietinger | 434/301 |
| 2011/0196658 A1* | 8/2011 | Lohmann et al. | 703/6 |
| 2011/0257953 A1* | 10/2011 | Li et al. | 703/14 |
| 2011/0277560 A1* | 11/2011 | Barnett et al. | 73/862.045 |
| 2012/0158334 A1* | 6/2012 | Agoston et al. | 702/67 |

OTHER PUBLICATIONS

Carl Werner, Claus Høyer, Andrew Ho, Metha Jeeradit, Fred Chen, Bruno Garlepp, William Stonecypher, Simon Li, Akash Bansal, Amita Agarwal, Elad Alon, Vladimir Stojanovic and Jared Zerbe; "Modeling, Simulation, and Design of a Multi-Mode 2-10 Gb/sec Fully Adaptive Serial Link System;" 2005; IEEE Custom Integrated Circuits Conference; pp. 709-716.*

"Serial Data Link Analysis (SDLA) SLE/SLA Option for Tektronix DPO/DSA/MSO70000 Series Oscilloscopes;" Oct. 2, 2011; Tektronix; http://www.tek.com/sites/tek.com/files/media/media/resources/55W_23293_2.pdf; pp. 1-8.*

"Agilent Technologies' New Serial Data Equalization Software Enables Oscilloscope Users to Test High-Speed Serial Designs;" Dec. 8, 2008; Agilent; http://www.agilent.com.sg/about/newsroom/presrel/2008/08dec-em08199.html; pp. 1-2.*

LeCroy Corporation: "An Introduction to S-Parameters", Lecroy website, Mar. 1, 2009, XP002714990, Retrieved from the Internet: URL: http://cdn.teledynelecroy.com/files/appnotes/lab1025.pdf, retrieved on Oct. 16, 2013.

LeCroy Corporation: "Using Lecroy's EyeDoctor II", LeCroy website, Mar. 1, 2009, XP002714989, Retrieved from the Internet: URL: http://cdn.teledynelecroy.com/files/appnotes/lab_wm778.pdf, retrieved on Oct. 16, 2013.

European Search Report and Written Opinion for Application No. 13171502.1, dated Oct. 16, 2013, 6 pages.

* cited by examiner

SERIAL DATA LINK MEASUREMENT AND SIMULATION SYSTEM

CROSS-REFERENCE TO RELATED APPLICATIONS

The present application is a non-provisional patent application claiming the benefit of provisional U.S. Patent Application Ser. No. 61/658,368, filed Jun. 11, 2012, which provisional U.S. Patent Application is incorporated herein by reference.

BACKGROUND OF THE INVENTION

The present invention relates to serial data link system analysis, and more particularly to a serial data link measurement and simulation system analysis interface.

Currently high speed signaling for a number of designs and standards for serial data links has become severely channel, or interconnect, limited. The result is that an eye diagram, which represents a digital signal transmitted over the serial data link, is often closed at the receiver. Equalization methods are used both for the transmitter as well as for the receiver to open the eye diagram and operate the serial data link to assure accurate transfer of digital information from a transmitter to the receiver.

There are several challenges when measuring or debugging the serial data link when operating on a severely limited channel: the channel and the transmitter interact in a complex way; the eye diagram at the receiver is nearly or completely closed; the receiver doesn't discriminate the digital signal directly but only after equalization; etc. FIG. 1 represents a serial data link having a transmitter at one end with transmitter equalization, a transmitter connector, a cable, a receiver connector and a receiver with receiver equalization. As indicated by the associated signal diagrams, the output from the transmitter has a very clear eye diagram, while the signal at the receiver appears to have no discernible eye diagram prior to equalization. The equalization attempts to recreate the eye diagram as transmitted from the transmitter, but the result is not ideal.

What is tested in such a serial data link is the transmitter plus channel combination which may include a transmitter (Tx) printed circuit board (PCB), a cable with its connectors, and a receiver (Rx) printed circuit board. The Rx is usually represented by an equalizer emulator in a test instrument, such as an oscilloscope. However, the connection of the test instrument to the transmitter, or to any point within the serial data link, presents its own distortions which need to be accounted for in order to produce reliable, usable measurements.

Many test and measurement manufacturers, such as Tektronix, Inc. (Tektronix), Agilent Technologies (Agilent) and Teledyne LeCroy (LeCroy), have had serial data link measurement systems for several years. However, none has represented the system in a way that totally and properly ties together all aspects of the serial data link system. These systems generally are based upon S-parameter block models, where S-parameters are ratios that represent how much of a signal introduced at an input port of a block is either reflected back to the input port, is passed through to an output port, appears as cross-talk (coupling between lines having different signals) on an adjacent channel within the block, the adjacent channel having its own input and output ports, or is cross-coupled (mutual coupling between two lines of A and B components representing the same signal) to an adjacent signal line.

For example, LeCroy has a serial data link package named Eye Doctor which uses a full S-parameter block schematic diagram to model the serial data link system. This system does allow full S-parameter modeling, but it does not tie it all together with the overall serial data link model, making it somewhat complex and difficult for a user.

LeCroy also has a subsequent serial data link package, Eye Doctor II, which uses a digital signal processing (DSP) signal flow model rather than a left-to-right virtual layout of the serial data link channel. This model does not completely represent cross-talk, cross-coupling or full cascading of S-parameters with the menus used. Detail of the processing flow is still somewhat obscure and confusing.

The current Tektronix serial data link package incorporates de-embedding of a fixture block, representing the disturbances caused by the connection of the test instrument, and the embed of a channel block. The Tektronix package incorporates a menu which shows the serial data model flow, but presents the fixture block as hanging in space with a wire, suggesting the connection test point but not the actual connection. The associated menu view is not optimal for the user in showing how things are connected and how the signal processing flow is implemented. However, this model does not correctly represent cross-talk, cross-coupling or full cascading of S-parameters from block to block.

Agilent has a serial data package that has various pieces of the serial data link model features scattered through various test instrument menus. It is not tied together into one complete coherent system menu. The portion that does S-parameter modeling correctly represents the measured part of the system S-parameter blocks compared to the simulated portion of the blocks. However, the Agilent package combines the de-embed and embed blocks into one block each, which may be correct but is difficult to look at and understand since each block must be defined twice, once for the measurement circuit and once for the simulation circuit.

What is desired is a serial data link measurement and simulation system that is easier to use and properly represents cascaded S-parameters, AMI models, and cross-talk measurement and simulation. AMI stands for Algorithmic Modeling Interface, which is a recognized standard for receiver circuit function description.

BRIEF SUMMARY OF THE INVENTION

Accordingly the present invention provides a serial data link measurement and simulation system that provides an easy to use menu structure that ties together all the functions of the serial data link system. The serial data link measurement and simulation system for use on a test and measurement instrument presents on a display device a main menu having elements representing a measurement circuit, a simulation circuit and a transmitter. The main menu includes processing flow lines pointing from the measurement circuit to the transmitter and from the transmitter to the simulation circuit. The main menu includes a source input to the measurement circuit and one or more test points from which waveforms may be obtained. The simulation circuit includes a receiver. The measurement and simulation circuits are defined by a user, as is the transmitter which is common to both circuits, so all aspects of the serial data link system are tied together.

The objects, advantages and novel features of the present invention are apparent from the following detailed description when read in conjunction with the appended claims and attached drawing figures.

DETAILED DESCRIPTION OF THE INVENTION

Figure 1:
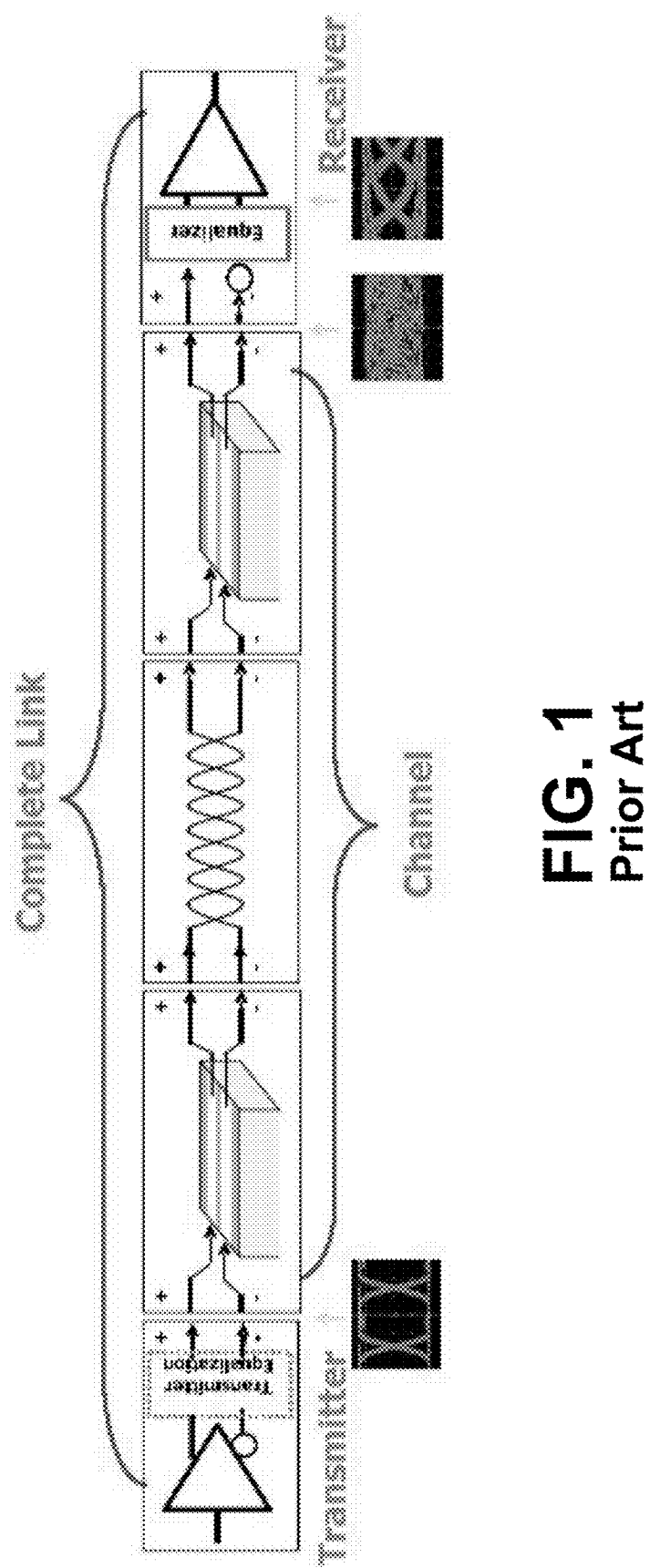
FIG. 1 is a block diagram view of a typical serial data link system.
Figure 2:
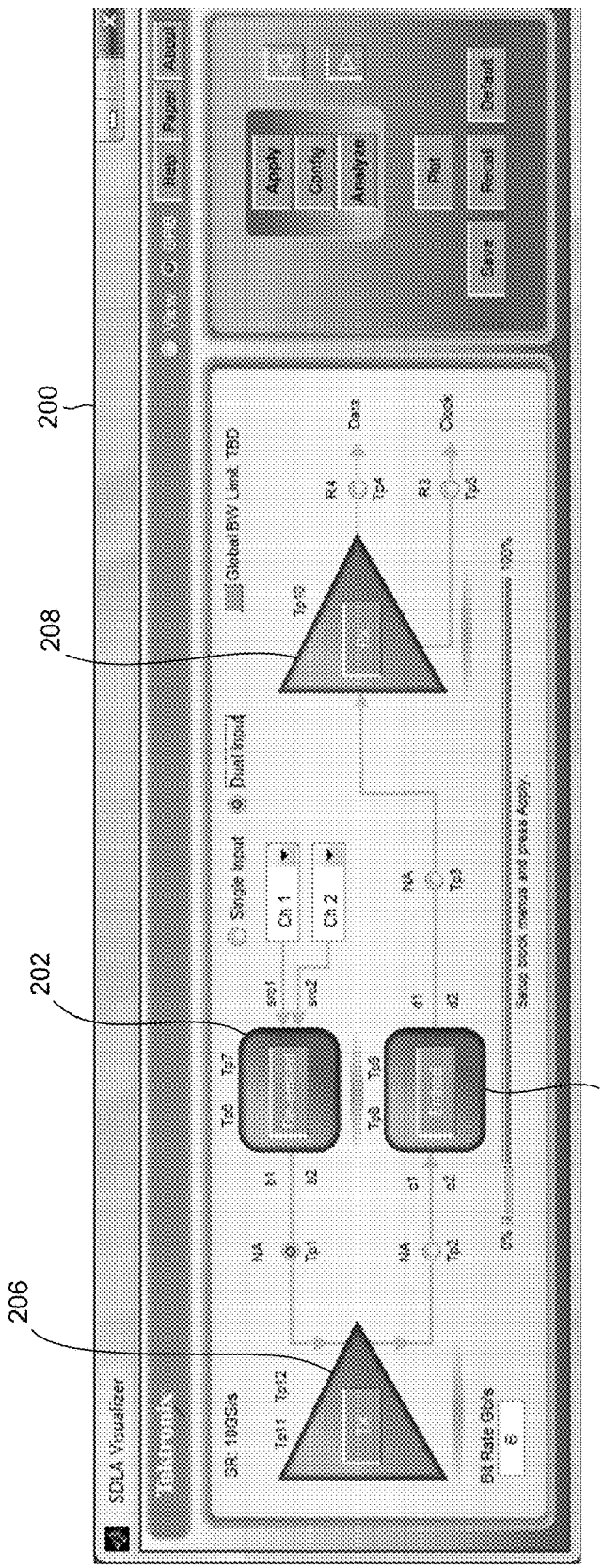
FIG. 2 is a plan view of a main menu for a serial data link measurement and simulation system according to the present invention.

Referring now to FIG. 2, a main menu according to the present invention is provided on a display 200 of a test and measurement instrument, such as an oscilloscope. The main menu shows two circuit models to be defined by a user, a measurement circuit 202 and a simulation circuit 204, which both connect to a transmitter (Tx) block 206. The Tx block 206 uses a Thevenin equivalent voltage to provide a point where an acquired waveform, as corrected by the measurement circuit 202, is passed into the simulation circuit 204. Thevenin's Theorem states that it is possible to simplify any linear circuit, no matter how complex, to an equivalent circuit with just a single voltage source and impedance.

The upper part of the main menu of FIG. 2 stemming from the Tx block 206 represents physical components used to obtain the acquired waveform from an input signal, such as probes, test instrument itself, fixtures and the portion of the channel between the Tx block 206 and fixtures. The main menu changes according to whether single or dual input mode is specified. This is where the S-parameter models that represent the physical components are defined and input to a de-embed block. In the absence of S-parameters, RLC (resistor, inductor, capacitor circuit model) or lossless transmission line models may be used. The de-embed block and one-half of the Tx block 206 represent the physical components that are used to acquire the waveforms that are labeled as source input to the system in order to provide a corrected waveform representing the original input signal. This is the actual physical system for which the user supplies models.

The Tx block 206 represents both a measured Tx model and a simulation Tx model. Ideally these are equal to each other, but the user may change the simulation model to be different from the measurement model. The measurement and simulation circuits 202 and 204 are tied together via the dual defined Tx model, which is the source for the simulation circuit 204.

Test points (Tp) in the circuit represented by the main menu are simulated probing locations that allow visibility of the serial data link at multiple test locations, including two movable test points within the de-embed block. Analysis software derives transfer functions and creates FIR (finite infinite response) filters for each test point. When the filters are applied to waveforms acquired from the test instrument, the analysis software produces waveforms at the desired test points. The waveform with the loading of the measurement circuit 202 may be viewed at Tp1, Tp6, or Tp7, as shown in FIG. 2.

The lower part of the main menu diagram of FIG. 2 stemming from the Tx block 206 represents a simulation circuit 204. Now that the waveforms have been de-embedded back to the Tx block 206, the simulation circuit 204 is used to embed a simulated channel to the Tx Block 206. Tp2 shows the Tx output waveform without the loading of the measurement circuit 202. The S-parameter models for the link to be simulated need to be defined and input to an embed block. Again, RLC or lossless transmission line models may be used when S-parameters are not available. The load of a receiver (Rx) 208 is also modeled in the embed block. The Rx block 208 allows Rx equalization to be specified. The test points in this circuit allow visibility in between link components, including two movable test points within the embed block.

The embed block represents the simulation circuit 204 for the serial data link channel. The user enters cascade S-parameter models, or other types of models such as RLC circuits, to represent the simulated system. The Rx block 208 represents the simulated receiver of the serial data link system. The user enters input S-parameters which are tied directly to the output circuit of the embed block.

The arrows on the main menu circuit diagram show the order in which the analysis software processes the transfer functions. For the measurement circuit 202 part of the diagram, the actual signal flow is in the opposite direction of the arrows. For the simulation circuit 204, the actual signal flow direction is the same as the signal processing flow arrows.

The embed block allows a user to "insert" a simulated channel so that the closed eye (viewable at Tp3) may be observed. Now the Rx block 208 is used to open the eye and observe the signal after appropriate equalization, such as CTLE (Tp10) or FFE/DFE (Tp4) has been applied. The Rx block 208 allows the Rx equalization to be specified. Serial data receivers typically contain three kinds of equalizers: a continuous-time linear equalizer (CTLE), a feed-forward equalizer (FFE), and decision feedback equalizer (DFE)). CTLE, clock recovery, DFE and FFE equalizers are available in the Rx block 208. Alternatively, AMI models may be used to model silicon specific equalization algorithms. Additionally, three test points are available in the Rx block 208, which allow for visibility of the waveform after CTLE and after FFE/DFE, or alternatively an AMI model, have been applied.

The analysis software gives visibility over multiple test points simultaneously, providing virtual "observation points" of the signal that could not be probed otherwise. The transmitter signal may be viewed with the loading of the measurement circuit 202 at Tp1, and at the same time, the de-embedded measurement circuit 202 may be viewed at Tp2 with an ideal 50 Ohm load. There are many flexible options for labeling test points, and for mapping test points to math waveforms. It is easy to put the test point labels onto the test instrument waveform display 200, so the user can tell which waveform is which, and easy to apply the data to appropriate jitter or other measurement software, so that the user knows which waveform is being measured. A "delay" feature lets the user move the waveforms in time with respect to each other. (By default, the delay is removed from the test point filters, so that events are close to being time-aligned.) Once the simulation and measurement circuits 202 and 204 have been defined, the user can easily save test point filters that are used with the test instrument math system. The analysis software may provide multiple waveforms, such as four math and two reference, which are simultaneously visible on the test instrument graticule at one time, allowing visibility of the serial data link at different locations. The analysis software allows for dynamic configuration of test points in order to best use the test instrument math channels, i.e. after de-embedding, CTLE, etc. Also, test points may be moved on the schematic drawing, providing maximum flexibility.

The main menu is used to configure the blocks, models, and test points, and to apply, plot and analyze the data. Processing and analysis operate only on waveforms that are displayed on the test instrument. The user may select from actively acquired channel signals, math waveforms or reference waveforms.

The de-embed block contains the circuit models that represent the actual hardware probe, fixtures, etc. that were used to acquire the waveforms with the test instrument acquisition system. Here, the effects of the fixture, probe, scope and other acquisition and measurement hardware upon the DUT signal may be defined, the S-parameter reference impedance re-normalized, and singled-ended to mixed mode conversion performed. Also a menu for Thru, File, RLC and T-line options may be provided, a menu for adding and configuring a high Z-probe may be provided, etc.

Test point output waveforms are displayed live on the test instrument. A test point and bandwidth manager may be accessed by pressing a test point on the system circuit diagram on the main menu. From here, the user may configure the individual output waveforms and save test point filters.

The Tx block 206 represents the model of the serial data link transmitter that is driving both the measurement circuit model 202 and the simulation circuit model 204. Pressing Tx on the main menu brings up a Tx configuration menu, where the user may select files and view plots. It also gives the user access to a Tx emphasis menu in order to select emphasis, de-emphasis or pre-emphasis filters, read from FIR filters and make other choices.

The embed block allows the user to "insert" the channel based on its S-parameters, as a lossless transmission line, or as an RLC model, in order to observe the waveforms at the various test points on the simulation circuit model 204. Pressing Embed on the main menu brings up an embed menu.

The Rx block 208 represents the model for the serial data link receiver for the simulation side of the circuit drawing. Pressing Rx on the main menu brings up an Rx configuration menu. Here, the user may apply CTLE equalization, perform clock recovery, and apply FFE/DFE equalization. Alternatively, the user may set up an AMI model that uses files with implementation of equalization algorithms to emulate actual silicon.

The Apply button computes test point filters and applies them to the test instrument. The Analyze button performs waveform analysis with an appropriate software application, such as jitter analysis, with the test point signals, and the recovered data and clock signals selected for analysis.

Figure 3:
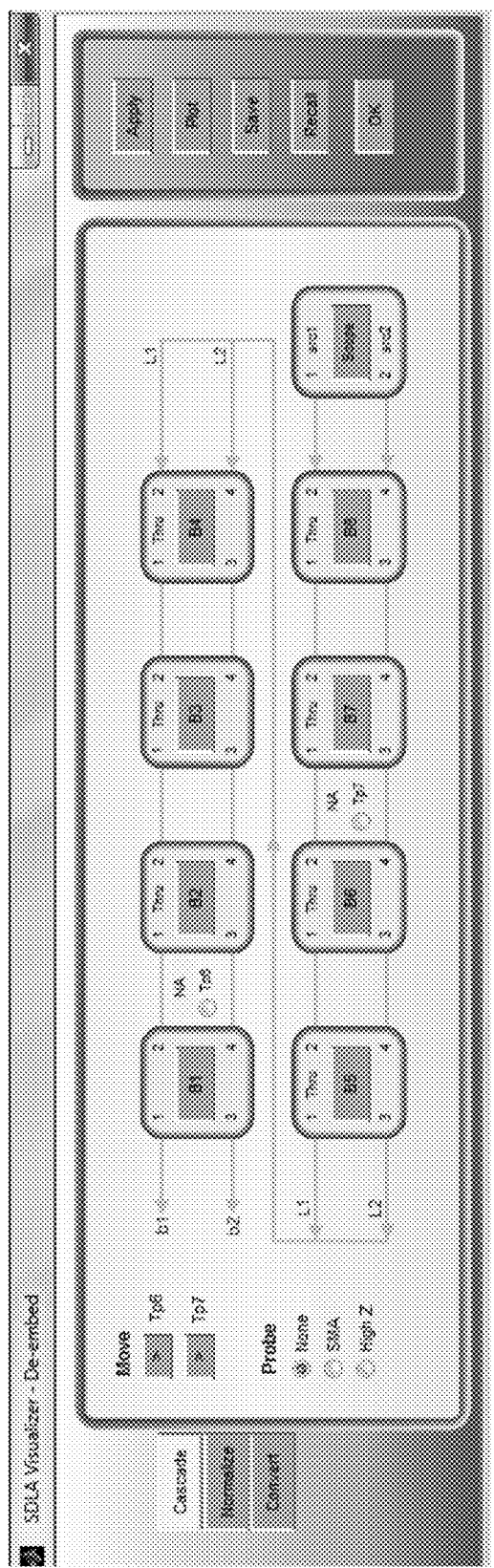
FIG. 3 is a plan view of cascaded S-parameter blocks representing a de-embed portion of the main menu of FIG. 1 according to the present invention.

FIG. 3 shows the de-embed configuration menu when the DeEmbed block 202 is selected on the main menu of FIG. 2. A cascade of blocks, B1-138, is shown from an oscilloscope as the test instrument, with the signal flow moving from right to left. These blocks represent a set of cascaded S-parameters for the measured system used to acquire the waveforms. Some of the choices include: four port S-parameters; two 2-port S-parameters; RLC; transmission line; FIR filters; probe models; etc.

Figure 4:
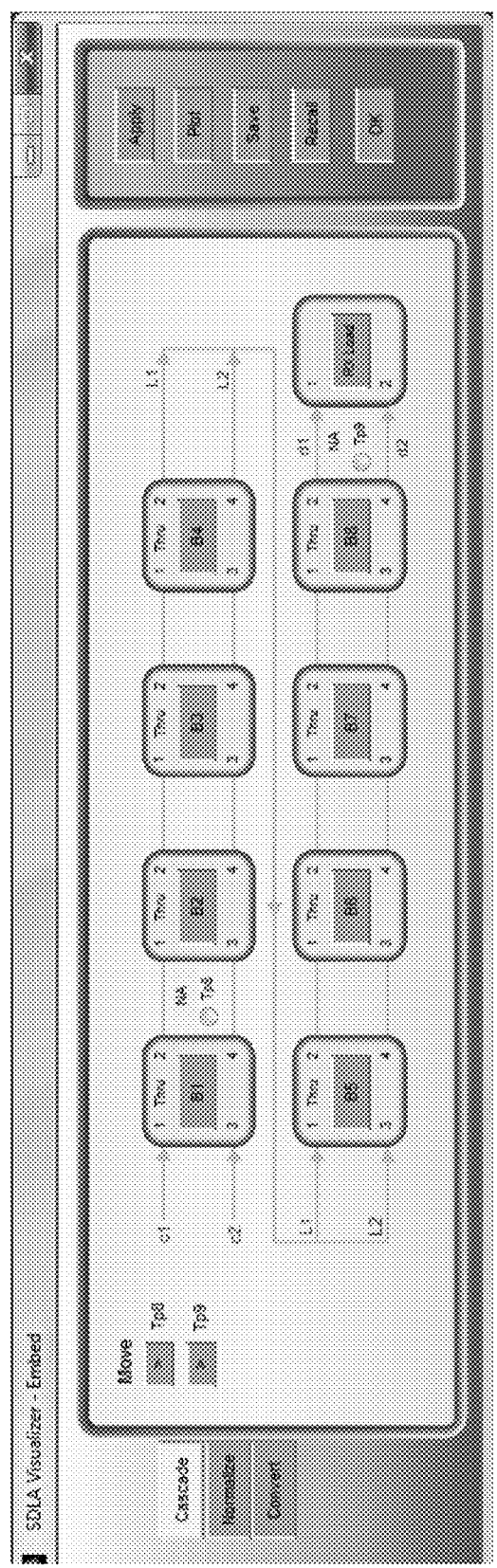
FIG. 4 is a plan view of cascaded S-parameter blocks representing an embed portion of the main menu of FIG. 1 according to the present invention.

FIG. 4 shows the embed configuration menu when the Embed block 204 is selected on the main menu of FIG. 2. A cascade of blocks, B1-138, is shown from the transmitter to the receiver for the simulation circuit 204. This uses the same types of model blocks as for the de-embed configuration. The signal flow in the embed configuration moves from left to right.

Figure 5:
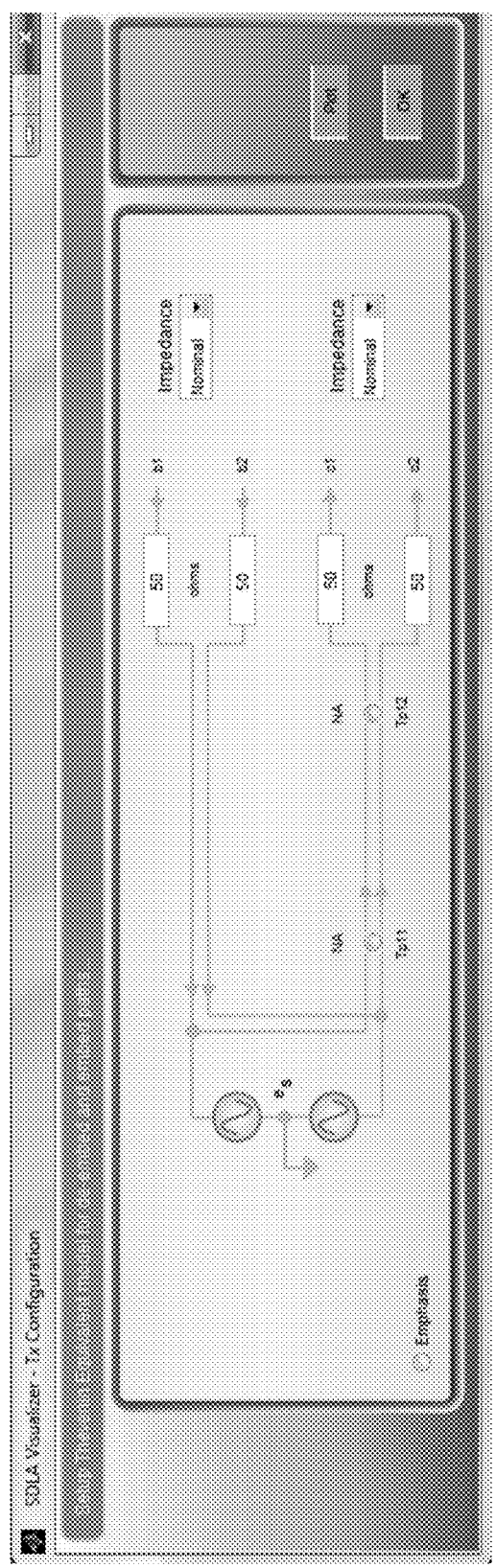
FIG. 5 is a plan view of elements representing a transmitter portion of the main menu of FIG. 1 according to the present invention.

FIG. 5 shows the Tx configuration menu with nominal impedances when the Tx block is selected on the main menu of FIG. 2. The Tx model may be represented with S-parameter or nominal source impedance specified by the user. The de-embed operation is performed back to the $e_s$ voltage source shown in this model. This voltage becomes the source for the embed simulation circuit 204. The Tx model ties the measured waveforms from the measurement circuit 202 into the simulation circuit 204. The measured S-parameter circuit and the simulated S-parameter circuits are tied together at the voltage source without the embed system affecting the de-embed system, since the impedance of the voltage source is zero ohms and zero reactance. Thus all processing paths and S-parameter connection points are fully shown and specified.

Figure 6:
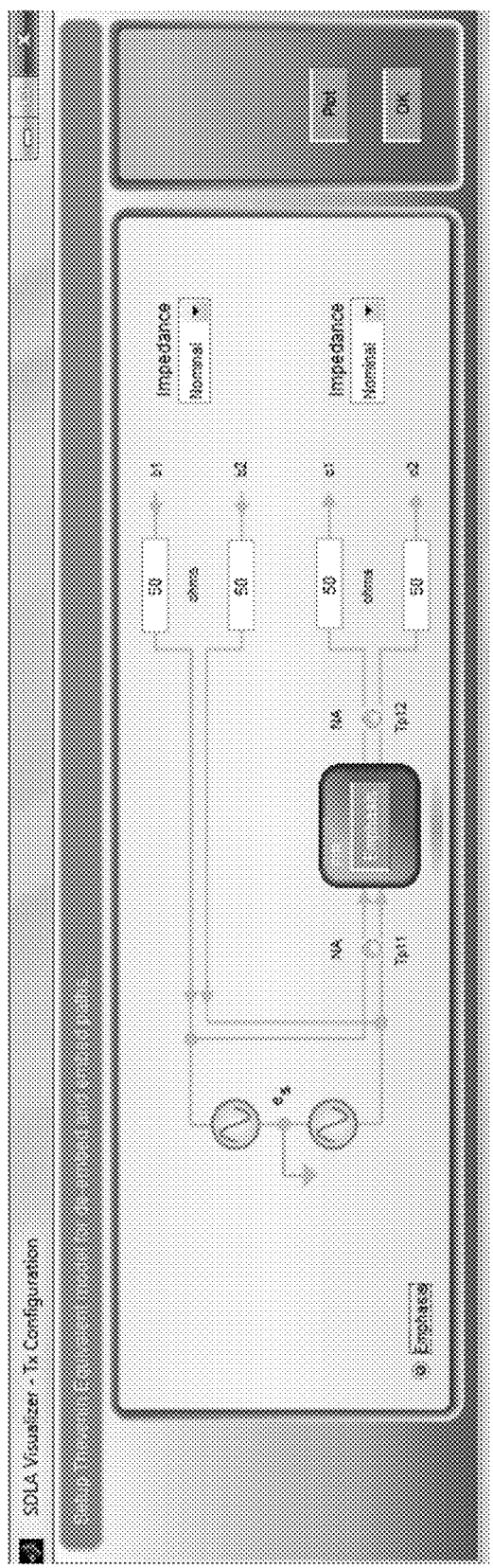
FIG. 6 is a plan view of another embodiment of the transmitter portion of the main menu of FIG. 1 including an emphasis filter according to the present invention.

The Tx model may be selected to have a FIR emphasis filter, as shown in FIG. 6, without interfering with the S-parameter model circuits because it is tied directly to the voltage source which has zero internal impedance. The Tx model also may be switched to use an AMI circuit model provided by the user. Thus the Tx model contains S-parameters for source impedance, emphasis FIR filters and Thevenin voltage source.

Figure 7:
FIG. 7 is a plan view of configuration parameters for a receiver portion of the main menu of FIG. 1 according to the present invention.
Figure 8:
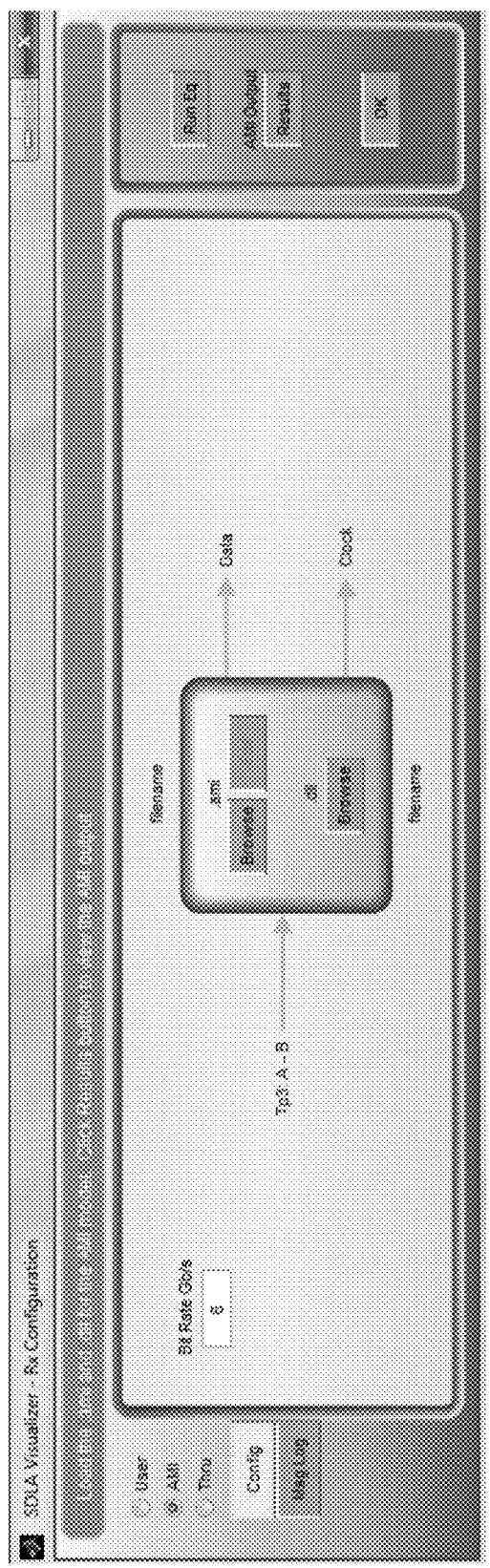
FIG. 8 is a plan view of an alternate receiver portion of the main menu of FIG. 1 as an AMI receiver according to the present invention.

The Rx model of FIG. 7 offers you three modes in three choices from the radio buttons on the left: User, AMI, and Thru. User Mode gives access to equalization tools and options for recovering the data stream and clock by correcting for the effects of insertion loss, cross-talk, reflection, and noise. Many CTLE, clock recovery and FFE/DFE parameters may be specified. This mode also implements the behavioral equalizers of PCI Express Gen3, SAS 6G, USB3, etc.

AMI Mode allows the user to emulate AMI models, which are descriptions of the equalizers provided by chip designers and manufacturers, as well as electronic design automation (EDA) tools which provide similar plug-in functionality. The analysis software only emulates the digital part of the AMI model in the Rx block 208. The analog part of the model is neglected in the Rx block 208, but can be modeled using the Embed block, where the S-parameter file, T-line model, and RLC circuit models may be used to model the Rx package and terminations.

When using Thru mode, the output of Tp4, is the same as the input to Tp3 in FIG. 2.

The system includes third tier level menus, such as block model representations and test point representations. For example, a test point waveform generally appears on the test instrument screen created by a math function within the test instrument. The filters for these test points are computed by the analysis software based on the block parameter definitions provided by the user in the system modeling menus, described above.

Figure 9:
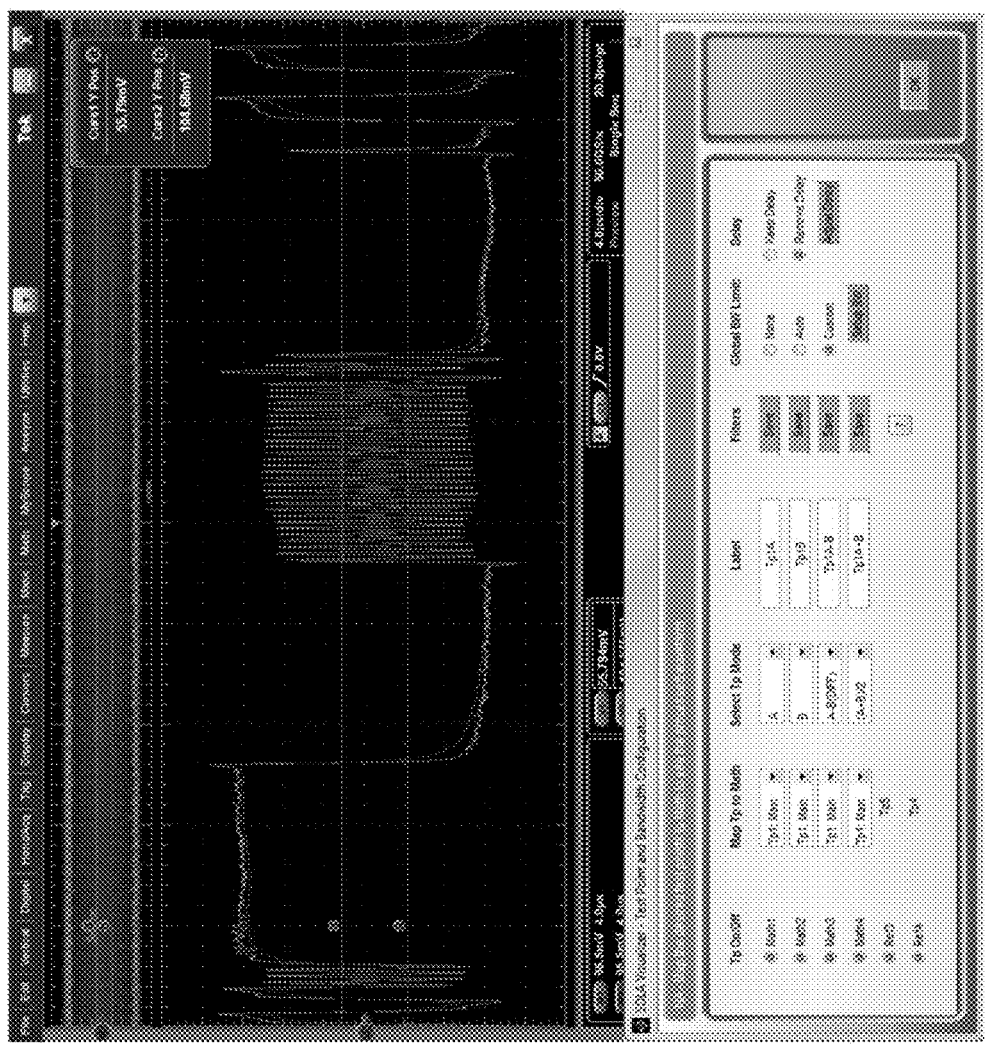
FIG. 9 is a plan view of waveforms from test points in the main menu of FIG. 1 including a test point configuration view according to the present invention.

FIG. 9 shows a menu system to assign test points to math waveform slots on the test instrument, in this instance an oscilloscope. A single ended test point may have only one transfer function filter associated with it. However, FIG. 9 shows an example of a differential test point which may have up to four transfer functions associated with it. There are two filters for the A waveform and for the B waveform. There are also two filters for differential mode and two filters for common mode. A math function may be written to subtract the waveforms obtained from A and B to obtain the differential mode waveform. Another summation math function may be created to obtain the common mode waveform for the test point.

Figure 10:
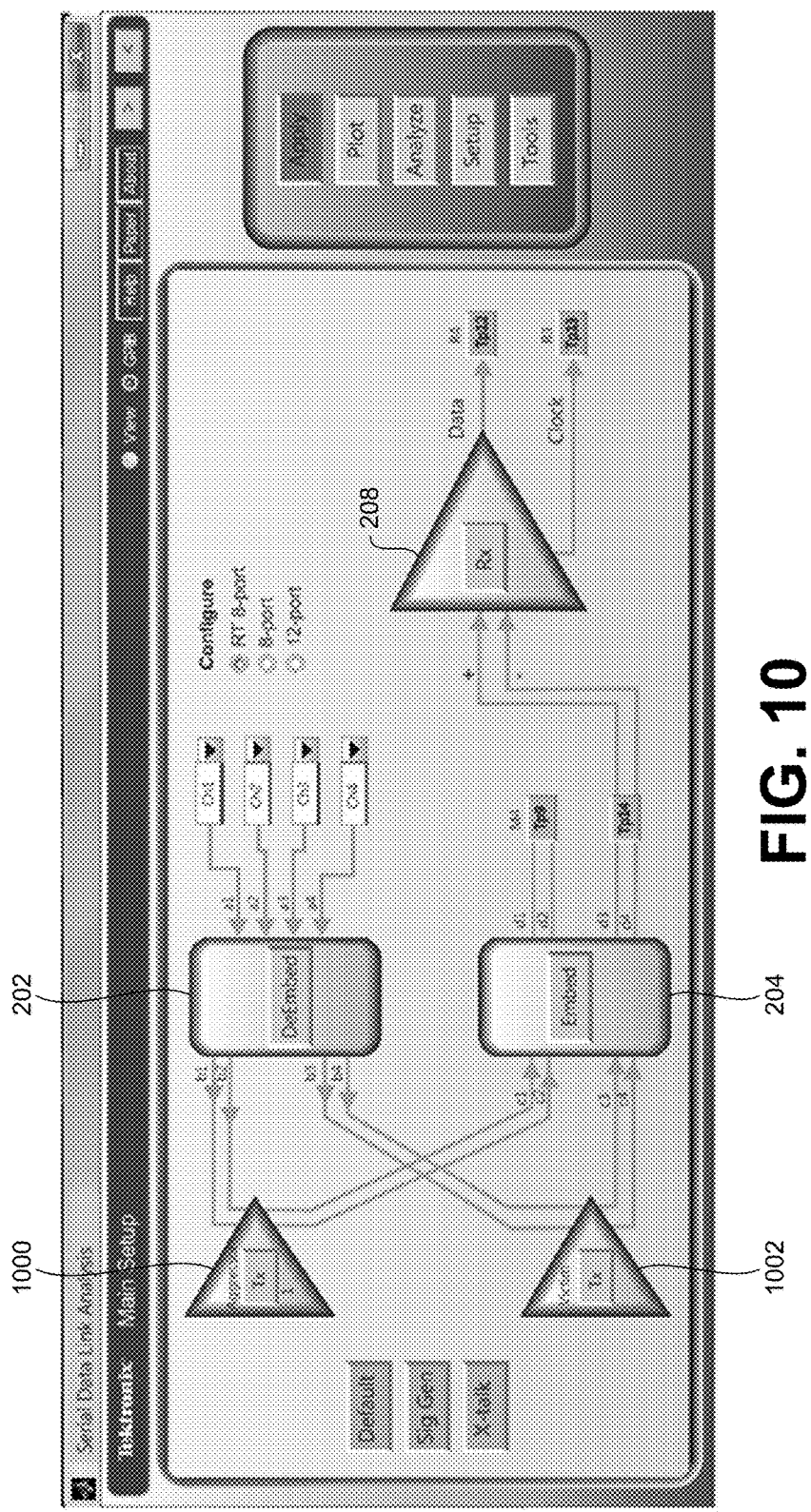
FIG. 10 is a plan view of an alternate configuration of the main menu representing one form of cross-talk according to the present invention.

Additional main menus may be configured to support different options and capabilities, such as de-embed only, signal simulation, cross-talk, etc. The de-embed block 202 of FIG. 2 may be replaced by a signal generator to replace the live waveform input to the system. A de-embed view may be selected without the embed side. Finally, as shown in FIG. 10, cross-talk view may be provided. Many other cross-talk configurations may be used, depending upon the source of the cross-talk-cross-channel, interference source or sources, etc. As an example, the basic cross-talk menu configuration may have two or more transmitter models 1000 and 1002, but the same basic measurement and simulation circuits 202 and 204 are still maintained into and out of each of these transmitter models. The cross-talk menu configuration may have two or more transmitter models, but the same measurement and simulation circuits 202 and 204 are maintained into and out of these transmitter models.

Figure 11:
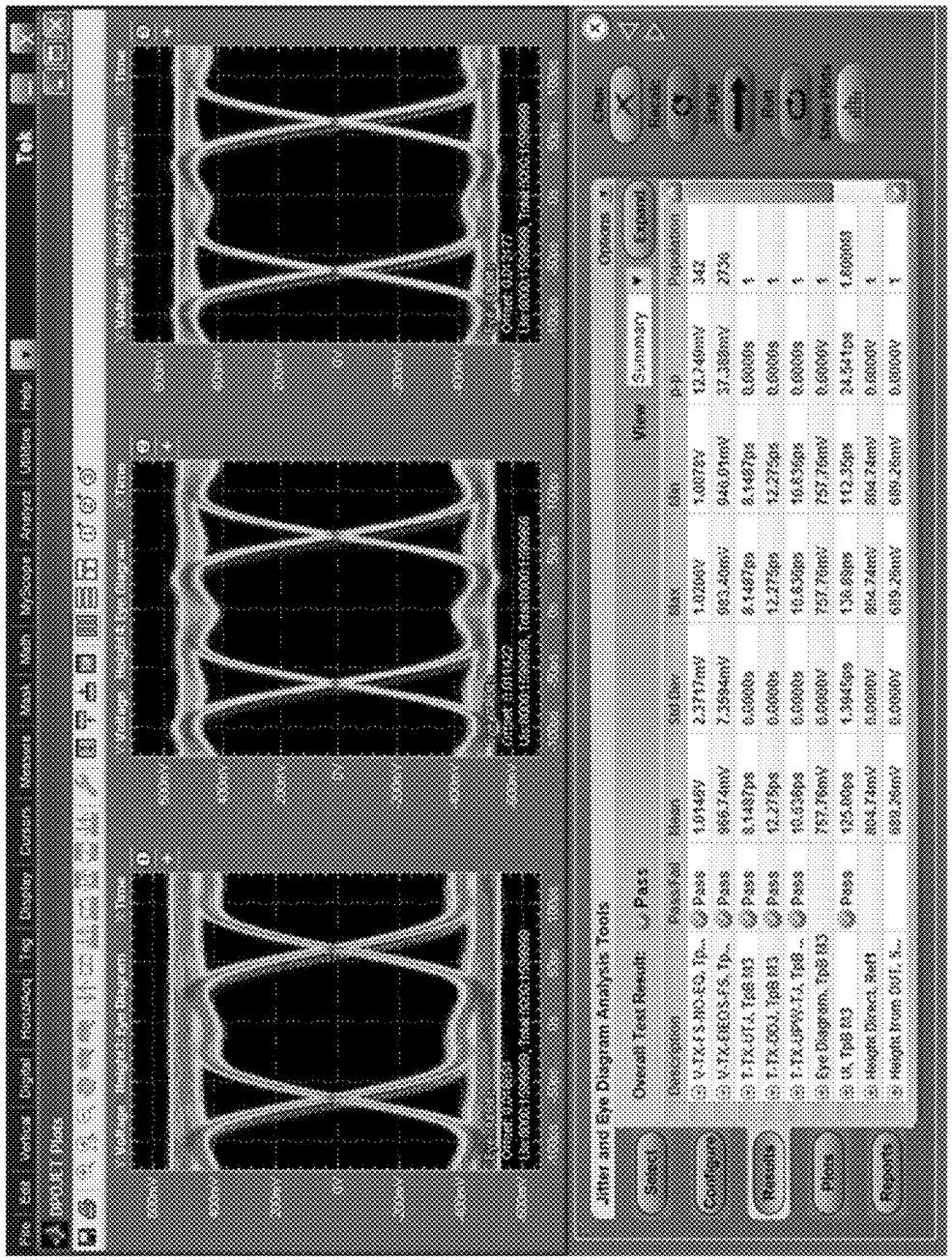
FIG. 11 is a plan view of waveforms output from additional processing software applied to waveforms from test points in the main menu of FIG. 1 according to the present invention.

The analyze button, mentioned above, provides a means for sending the output waveform data to other applications, such as jitter analysis, which then perform measurements on the data. Also eye diagrams may be created, as shown in FIG. 11.

Finally, plotting capability is provided by the Plot button, shown on FIG. 2. For block level where S-parameters are in use, it is important to provide multiple views of the S-parameter plots so that the user may evaluate where system problems are located when the results of test point filters are not correct. The plots include magnitude and phase and impedance in the frequency domain. They may also include step and impulse response of the S-parameters in the time domain. For test points it is important to plot the transfer function phase and magnitude in the frequency domain, the time domain step and impulse responses, test instrument live trace time domain waveform with test point filter applied, and eye diagrams for live waveforms with test point filter applied. Also for bandwidth (BW) limit filter design it is important to plot frequency domain magnitude response of the filter.

Thus the present invention provides a serial data link measurement and simulation system by breaking the system down into a de-embed block to remove effects of the measurement circuit 202, by tying the measurement system back into the simulation system using the Tx model with a dual definition of de-embed and embed, and by using the Tx model as the input to the simulation circuit 204 which includes an embed block and a Rx block 208—the system inputs being from a test instrument such as an oscilloscope and the system outputs being represented by test points—with process flow being indicated as right to left in the measurement circuit 202 and left to right in the simulation circuit 204, tying all aspects of the serial data link measurement and simulation process together.

What is claimed is:

1. A method of configuring a serial data link measurement and simulation system on a test and measurement instrument to analyze a serial data link, the method comprising the steps of:

presenting, within a single window or single tab on a display device of the test and measurement instrument, a main menu comprising a schematic diagram representation of the serial data link, the main menu having separate elements representing a measurement circuit, a simulation circuit, a transmitter, and a test point therebetween, having processing flow lines pointing from the measurement circuit to the transmitter and from the transmitter to the simulation circuit, and having a first control to open a first sub-menu including a user input configured to receive a model for the measurement circuit and a second control to open a second sub-menu including a user input configured to receive a model for the transmitter;

acquiring a waveform from the serial data link, by the measurement circuit, into a waveform memory in the test and measurement instrument as an acquired waveform;

generating, in the waveform memory of the test and measurement instrument, a test point output waveform based on the acquired waveform, the test point output waveform visualizing a signal at a physical location in the serial data link corresponding to the location of the test point in the main menu schematic diagram; and displaying the test point output waveform on the display device of the test and measurement instrument;

wherein the measurement circuit comprises physical components, including the test and measurement instrument, used to acquire the acquired waveform from the serial data link, and wherein the first sub-menu comprises a de-embed menu presented on the display device of the test and measurement instrument as a schematic diagram having a plurality of de-embed blocks and a moveable test point therebetween, each de-embed block including a user input configured to receive from the user a circuit model for one of the physical components used to acquire the acquired waveform;

wherein the transmitter comprises the transmitter of the serial data link and is presented in the main menu as a transmitter block driving both the measurement circuit and the simulation circuit, and wherein the second sub-menu comprises a transmitter menu presented on the display device of the test and measurement instrument and configured to receive input from the user to alter parameters associated with the measurement circuit and parameters associated with the simulation circuit; and wherein the second sub-menu further comprises a measured transmitter model and a simulated transmitter model, each defined by the user, the measured transmitter model presented as receiving a corrected waveform from the measurement circuit and the simulated transmitter model presented as being a waveform source for the simulation circuit so that the measurement and simulation circuits are correlated at a voltage source without an embed block affecting the de-embed block.

2. The method as recited in claim 1 wherein the transmitter models comprise S-parameters for source impedance and cross-talk, finite impulse response filters modeling equalization for the transmitter, and a Thevenin voltage source so that the transmitter ties the measurement circuit into the simulation circuit.

3. The method as recited in claim 1 wherein the simulation circuit comprises a circuit between the transmitter and a receiver of the serial data link, and is presented as an embed block that represents a set of models for the serial data link being simulated.

4. The method as recited in claim 3 wherein the embed block further comprises a receiver model representing a receiver being simulated.

5. The method as recited in claim 3 wherein the set of models includes ones selected from the group consisting of S-parameters, RLC and lossless transmission lines.

6. The method as recited in claim 1 further comprising the step of displaying on the main menu a plurality of representations for crosstalk measurement and simulation.

7. The method as recited in claim 6 wherein the plurality of representations for crosstalk measurement and simulation comprise a basic crosstalk menu configuration having two or more transmitter models while maintaining the measurement and simulation circuits.

8. The method as recited in claim 1 further comprising the step of selecting via an analyze button on the main menu the acquired and output waveforms for input to applications, as desired, for further measurement and plot representations by the test and measurement instrument.

9. The method as recited in claim 1 further comprising the step of providing by a user transfer functions and filters for the test point, which transfer functions and filters derive the test point output waveform from the acquired waveform according to the processing flow lines.

* * * * *